(12) United States Patent
Li

(10) Patent No.: US 12,514,096 B2
(45) Date of Patent: Dec. 30, 2025

(54) BACKPLANE, BACKLIGHT MODULE AND DISPLAY PANEL

(71) Applicant: Shenzhen China Star Optoelectronics Semiconductor Display Technology Co., Ltd., Guangdong (CN)

(72) Inventor: Juan Li, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 729 days.

(21) Appl. No.: 17/759,392

(22) PCT Filed: Jun. 21, 2022

(86) PCT No.: PCT/CN2022/100214
§ 371 (c)(1),
(2) Date: Jul. 25, 2022

(87) PCT Pub. No.: WO2023/226121
PCT Pub. Date: Nov. 30, 2023

(65) Prior Publication Data
US 2024/0215391 A1  Jun. 27, 2024

(30) Foreign Application Priority Data
May 24, 2022 (CN) .......................... 202210573695.7

(51) Int. Cl.
*H10K 59/80* (2023.01)
*H10K 59/124* (2023.01)
(Continued)

(52) U.S. Cl.
CPC ......... *H10K 59/873* (2023.02); *H10K 59/124* (2023.02); *H10K 59/131* (2023.02); *H10K 77/111* (2023.02)

(58) Field of Classification Search
None
See application file for complete search history.

(56) References Cited

U.S. PATENT DOCUMENTS 11,456,431 B2 * 9/2022 Ke ..................... H10K 50/844
2017/0104178 A1   4/2017 Okada et al.
(Continued)

FOREIGN PATENT DOCUMENTS

CN         107046006 A      8/2017
CN         107863459 A      3/2018
(Continued)

OTHER PUBLICATIONS

Chinese Office Action issued in corresponding Chinese Patent Application No. 202210573695.7 dated Dec. 27, 2024, pp. 1-7.
(Continued)

*Primary Examiner* — Long Pham

(57) ABSTRACT

The present disclosure provides a backplane, a backlight module, and a display panel. The backplane comprises a flexible substrate, a planarization layer, and a driving circuit layer, wherein a surface roughness of one side of the planarization layer close to the driving circuit layer is smaller than a surface roughness of one side of the flexible substrate close to the planarization layer.

17 Claims, 3 Drawing Sheets

(51) Int. Cl.
*H10K 59/131* (2023.01)
*H10K 77/10* (2023.01)

(56) References Cited

U.S. PATENT DOCUMENTS

2019/0019951 A1* 1/2019 Nakagawa ........... H10K 77/111
2019/0173029 A1* 6/2019 Jin ....................... H10K 50/81
2021/0408408 A1* 12/2021 Ke ....................... H10K 77/111

FOREIGN PATENT DOCUMENTS

| | | | |
|---|---|---|---|
| CN | 110071230 A | | 7/2019 |
| CN | 110518118 A | | 11/2019 |
| CN | 110571348 A | | 12/2019 |
| CN | 111146342 A | | 5/2020 |
| CN | 111900191 A | | 11/2020 |
| CN | 113053923 A | | 6/2021 |
| CN | 114335091 A | | 4/2022 |
| KR | 20210078802 | * | 6/2021 |

OTHER PUBLICATIONS

International Search Report in International application No. PCT/CN2022/100214, mailed on Dec. 19, 2022.
Written Opinion of the International Search Authority in International application No. PCT/CN2022/100214, mailed on Dec. 19, 2022.

* cited by examiner

BACKPLANE, BACKLIGHT MODULE AND DISPLAY PANEL

TECHNICAL FIELD

The present disclosure relates to a technical field of display, and in particular, to a backplane, a backlight module and a display panel.

BACKGROUND

In current flexible backplane, a driving circuit layer is generally prepared directly on a glass substrate, and the glass substrate is then peeled off after transfer of a light-emitting diode (LED) in a rear rear stage is completed, so as to achieve the purpose of flexible display. However, depositing a metal conductive layer directly on the glass substrate tends to cause the glass substrate to be difficult to be peeled off, and therefore it is necessary to first deposit a flexible substrate on the glass substrate and then deposit a metal conductive layer on the flexible substrate to facilitate peeling the glass substrate off from the flexible substrate. However, since the flexible substrate is generally made of organic polymer, in the process of preparing the flexible substrate, there may be some residues caused by insufficient or incomplete reaction. Meanwhile, a large amount of dust and particles also present in the air and on a machine equipment result in a plurality of protrusions on an upper surface of a prepared flexible substrate. When the metal conductive layer is subsequently deposited on the flexible substrate, the metal conductive layer may climb a slope at a position where there is a protrusion, and the metal conductive layer may be easily pierced by the protrusion, resulting in disconnection, causing bright and dark lines, affecting results of lighting, and reducing yields. If a method of cleaning the machine equipment is used to reduce dust and particles, the machine time, manpower and materials of the flexible substrate are wasted, the protrusions cannot be completely cleaned, and there is also a risk of disconnection. Furthermore, if only a flexible substrate is provided between the glass substrate and the driving circuit layer, a risk of a damage to the metal conductive layer is high when the underlying glass substrate is peeled off. Therefore, it is necessary to improve this defect.

Technical Problem

Embodiments of the present disclosure provide a backplane, so as to improve yields and reduce costs of the backplane.

Technical Solution

Embodiments of the present disclosure provide a backplane, which comprises a flexible substrate, a planarization layer disposed on the flexible substrate, and a driving circuit layer disposed on the planarization layer, wherein a surface roughness of one side of the planarization layer close to the driving circuit layer is smaller than a surface roughness of one side of the flexible substrate close to the planarization layer.

Embodiments of the present disclosure provide a backlight module, which comprises a backplane and an optical film set, wherein the optical film set is located on a light-emitting side of the backplane, and the backplane comprises a flexible substrate, a planarization layer disposed on the flexible substrate, and a driving circuit layer disposed on the planarization layer, wherein a surface roughness of one side of the planarization layer close to the driving circuit layer is smaller than a surface roughness of one side of the flexible substrate close to the planarization layer.

Embodiments of the present disclosure provide a display panel, which comprises a backplane and a protective layer, wherein the protective layer is located on a light-emitting side of the backplane, and the backplane comprises a flexible substrate, a planarization layer disposed on the flexible substrate, and a driving circuit layer disposed on the planarization layer, wherein a surface roughness of one side of the planarization layer close to the driving circuit layer is smaller than a surface roughness of one side of the flexible substrate close to the planarization layer.

Technical Effects

Embodiments of the present disclosure provide a backplane, which comprises a flexible substrate, a planarization layer disposed on the flexible substrate, and a driving circuit layer disposed on the planarization layer, wherein a surface roughness of one side of the planarization layer close to the driving circuit layer is smaller than a surface roughness of one side of the flexible substrate close to the planarization layer. In the present disclosure, a planarization layer is disposed between a flexible substrate and a driving circuit layer, and a surface roughness of one side of the planarization layer close to the driving circuit layer is smaller than a surface roughness of one side of the flexible substrate close to the planarization layer, so as to planarize a difference between the flexible substrate and protrusions on the flexible substrate, reduce impact of protrusions on the driving circuit layer, enable the driving circuit layer to be deposited evenly, reduce risk of metal conductive layer being pierced and disconnected, improve reliability of the backplane and improve display quality. Moreover, there is no need to repeatedly clean the machine equipment, the process is simple, and the added planarization layer can also reduce risk of the metal conductive layer being damaged when the underlying glass substrate is peeled off.

DETAILED DESCRIPTION

Figure 1:
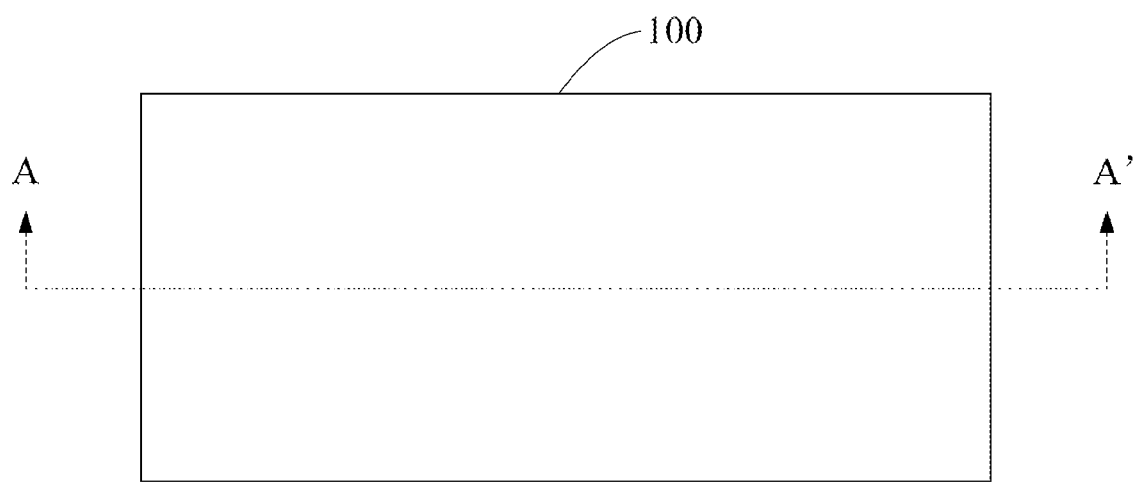
FIG. 1 is a top view of a backplane according to an embodiment of the present disclosure.

Technical solutions in embodiments of the present disclosure will be clearly and completely described below with reference to drawings in embodiments of the present disclosure. For clarity and ease of understanding and describing, dimensions and thickness of components depicted in the drawings are not to scale.

Figure 2:
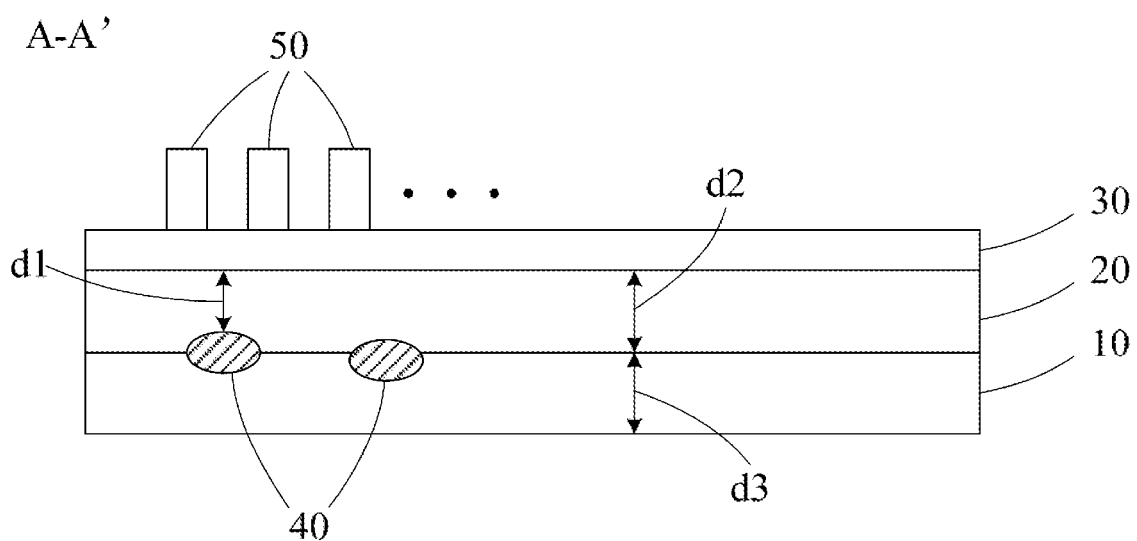
FIG. 2 is a cross-sectional view of the backplane in FIG. 1 along A-A' direction.

FIGS. 1 and 2 are a top view of a backplane according to an embodiment of the present disclosure and a cross-sectional view of the backplane in FIG. 1 along A-A' direction, respectively. A backplane 100 comprises a flexible substrate 10, a planarization layer 20 and a driving circuit layer 30. The planarization layer 20 is disposed on the flexible substrate 10; The drive circuit layer 30 is disposed on the planarizing layer 20. A surface roughness of one side of the planarization layer 20 close to the driving circuit layer 30 is smaller than a surface roughness of one side of the flexible substrate 10 close to the planarization layer 20.

It can be understood that in the prior art, a flexible substrate is generally prepared on a glass substrate, and a driving circuit layer is prepared on the flexible substrate, so that the glass substrate can be peeled off from the flexible substrate. However, since the flexible substrate is generally made of an organic polymer material, during the preparation process, there may be some residues caused by insufficient or incomplete reaction. Meanwhile, a large amount of dust and particles present in the air and on a machine equipment also result in a plurality of protrusions on an upper surface of a prepared flexible substrate. When the metal conductive layer is subsequently deposited on the flexible substrate, the metal conductive layer may climb a slope at a position where there is a protrusion, resulting in disconnection. If a method of cleaning the machine equipment is used to reduce dust and particles, the protrusions cannot be completely cleaned. Furthermore, if only a flexible substrate is provided between the glass substrate and the driving circuit layer, a risk of a damage to the metal conductive layer is high when the underlying glass substrate is peeled off.

In the present disclosure, a planarization layer 20 is added between the flexible substrate 10 and the driving circuit layer 30, the added planarization layer 20 may cover the protrusions 40 on the flexible substrate 10, provide an even substrate for despositing the metal conductive layer, may reduce a possibility of the metal conductive layer being pierced, especially for the process sites in which pressure needs to be applied on the plane in a rear stage. The added planarization layer 20 may further reduce a probability of the metal conductive layer climbing a slope at a position where protrusion 40 is located, reduce a risk of disconnection caused by climbing, reduce bright and dark lines caused by disconnection, and improve display quality. The added planarization layer 20 can cover the protrusions 40. After the planarizing process, there is no need to clean the machine equipment, and problems caused by cleaning can be reduced, and waste of manpower and material resources caused by cleaning can be avoided. There are many process sites in the preparation process of a backplane in the prior art, and the film is easy to be damaged. By adding the planarization layer 20, a total film layer thickness of the backplane 100 can be increased, and the damage to the film layer caused in the operation process, such as bending stress, and sharp scratches caused by undesirable operation can be reduced.

In an embodiment, a thickness d2 of the planarization layer 20 is greater than or equal to half of a thickness d3 of the flexible substrate 10 and less than or equal to twice of a thickness d3 of the flexible substrate 10 in a direction from the flexible substrate 10 to the planarization layer 20.

It should be noted that a material of the planarization layer 20 is an insulating material, which may be either an inorganic insulating material or an organic insulating material, wherein the planarizing effect of the organic insulating material is better than that of the inorganic insulating material. Therefore, if the planarization layer 20 is prepared by an organic insulating material, the thickness of the organic insulating material may be set to be thinner than that of the flexible substrate 10; and if the planarization layer 20 is prepared by an inorganic insulating material, the thickness of the inorganic insulating material may be set to be thicker than that of the flexible substrate 10.

In an embodiment, the material of the planarization layer 20 is an inorganic insulating material, the thickness d2 of the planarization layer 20 is greater than or equal to the thickness d3 of the flexible substrate 10 and less than or equal to twice of the thickness d3 of the flexible substrate 10 in the direction from the flexible substrate 10 to the planarization layer 20.

It should be noted that the metal conductive layer in the driving circuit layer 30 is generally patterned by using an acidic etching solution, and the acid etching solution may also have certain influence on the planarization layer 20. In this embodiment, the planarization layer 20 is prepared by using an inorganic insulating material, thus influence of the acid etching solution on the planarization layer 20 can be alleviated. Meanwhile, a thickness of the inorganic insulating material is set to be greater than or equal to the thickness d3 of the flexible substrate 10 and less than or equal to twice the thickness d3 of the flexible substrate 10, so that effectiveness and stability of the inorganic insulating material can be improved, and the planarizing effect can be better.

In an embodiment, the material of the planarization layer 20 is any one of silicon nitride, silicon oxide, and silicon oxynitride.

In an embodiment, the material of the planarization layer 20 is an organic insulating material, and the thickness d2 of the planarization layer 20 is greater than or equal to half of the thickness d3 of the flexible substrate 10 and less than the thickness d3 of the flexible substrate 10 in the direction from the flexible substrate 10 to the planarization layer 20.

It can be understood that, in this embodiment, the planarization layer 20 is prepared by using an organic insulating material, and planarizing effect of the organic insulating material is good, and therefore, the thickness of the organic insulating material can be set to be greater than or equal to half the thickness d3 of the flexible substrate 10 and less than the thickness d3 of the flexible substrate 10. In this way, the protrusions 40 on the flexible substrate 10 can be planarized, and since the flexibility of the organic insulating material is good, it is easy to bend, and an overall thickness of the backplane 100 will not be increased too much.

In an embodiment, the thickness d2 of the planarization layer 20 is greater than or equal to 10 microns and less than or equal to 20 microns in the direction from the flexible substrate 10 to the planarization layer 20. Specifically, when the flexible substrate 10 has a plurality of protrusions 40 on one side close to the planarization layer 20, a safty distance d1 from one side of the planarization layer 20 close to the driving circuit layer 30 to one side of the protrusions 40 away from the flexible substrate 10 is smaller than the thickness d2 of the planarization layer 20 in a direction from the flexible substrate 10 to the planarization layer 20.

It can be understood that the projections 40 are residues caused by insufficient or incomplete reaction in the preparation of the flexible substrate 10, or dust and particles falling from air and machine equipment, which can not be completely removed by a process of cleaning the machine equipment, and the cleaning process will waste machine time, manpower and materials. In the present disclosure, the planarization layer 20 is disposed on the flexible substrate 10, and a safty distance d1 is also present between an upper surface of the planarization layer 20 and the highest point of the protrusion 40. Therefore, the protrusion 40 cannot pierce the planarization layer 20, and does not affect the driving circuit layer 30 disposed on the planarization layer 20, and does not cause the metal conductive layer in the driving circuit layer 30 to climb or disconnect, thereby increasing stability of the backplane 100.

In an embodiment, the backplane 100 further comprises a plurality of light-emitting devices 50 on the driving circuit layer 30, and the plurality of light-emitting devices 50 are electrically connected to the driving circuit layer 30.

In an embodiment, the backplane 100 is a backplane of a backlight module. The light-emitting devices 50 are backlights, all of which are blue LEDs, or the backlights are a plurality of red LEDs, a plurality of green LEDs and a plurality of blue LEDs.

In an embodiment, the backplane 100 is a backplane of an organic light-emitting diode display panel, and the light-emitting devices are organic light-emitting layers, wherein the organic light-emitting layers are electrically connected to the driving circuit layer 30 through an anode (not shown).

In an embodiment, the backplane 100 is a backplane of a micro light-emitting diode display panel, and the light-emitting devices 50 are micro light-emitting diodes or mini light-emitting diodes.

Figure 3:
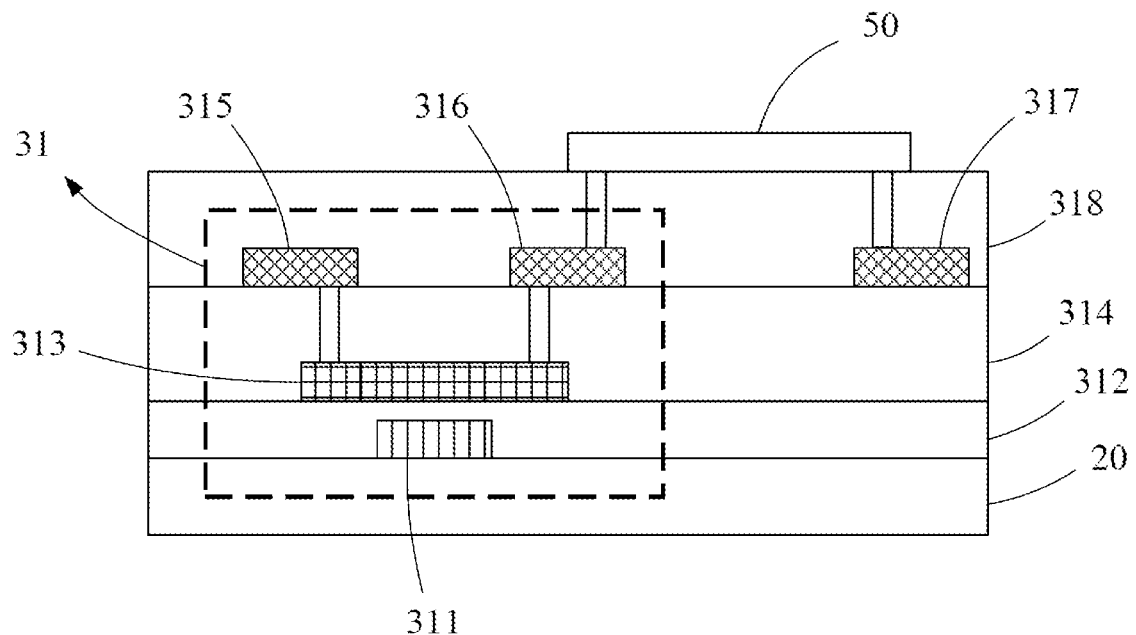
FIG. 3 is an enlarged view of a driving circuit layer according to an embodiment of the present disclosure.

In an embodiment, please refer to FIG. 3, which is an enlarged view of a driving circuit layer according to an embodiment of the present disclosure. In FIG. 3, the light-emitting device 50 is illustrated as a micro light-emitting diode for example, wherein the driving circuit layer 30 comprises a plurality of thin film transistors 31 on the planarization layer 20. In FIG. 3, only one thin film transistor 31 is illustrated as an example. The thin film transistors 31 comprise a gate layer 311, a gate insulating layer 312, an active layer 313, an interlayer insulating layer 314, a source 315, and a drain 316. The backplane also comprises a power supply line 317 and a passivation layer 318.

The gate layer 311 is located on the planarization layer 20, the gate insulating layer 312 covers the gate layer 311, the active layer 313 is located on the gate insulating layer 312, the interlayer insulating layer 314 covers the active layer 313, the source 315 and the drain 316 are located on the interlayer insulating layer 314, and the source 315 and the drain 316 are electrically connected to both ends of the active layer 313 through via-holes on the interlayer insulating layer 314, respectively.

The power supply line 317 is disposed in the same layer as the source 315 and the drain 316, and the light-emitting device 50 is electrically connected to the drain 316 and the power supply line 317 through a via-hole in the passivation layer 318.

Figure 4:
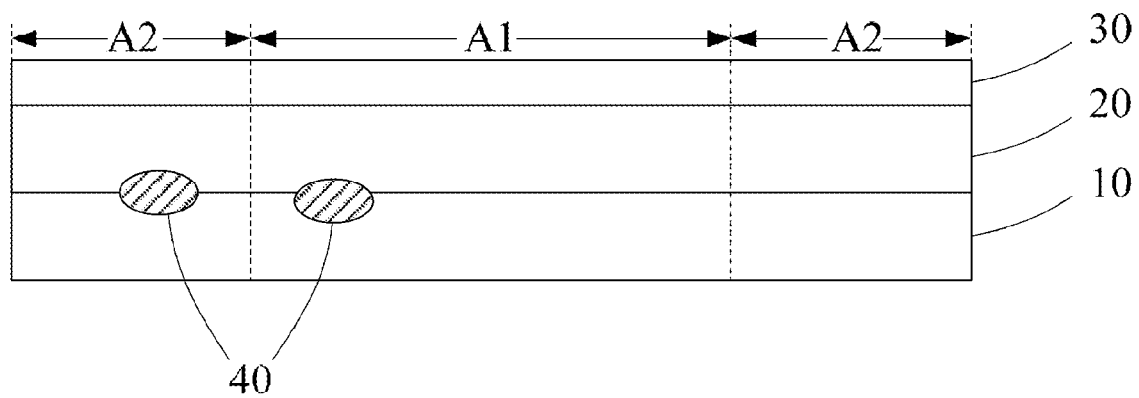
FIG. 4 is a schematic diagram of a basic structure of another backplane according to an embodiment of the present disclosure.

Next, with reference to FIG. 4, which is a schematic diagram of a basic structure of another backplane according to an embodiment of the present disclosure. The backplane 100 comprises a flexible substrate 10, a planarization layer 20, and a driving circuit layer 30. The planarization layer 20 is located on the flexible substrate 10; and the driving circuit layer 30 is located on the planarization layer 20. A surface roughness of one side of the planarization layer 20 close to the driving circuit layer 30 is smaller than a surface roughness of one side of the flexible substrate 10 close to the planarization layer 20.

In this embodiment, the the backplane 100 comprises a bending area A1 and non-bending areas A2 located on both sides of the bending area A1, wherein an elastic modulus of the planarization layer 20 located in the bending area A1 is greater than that of the planarization layer 20 located in the non-bending area A2.

It should be noted that the greater the elastic modulus, the less easily the material is deformed, and the greater the rigidity and hardness. Macroscopically, the elastic modulus is a measure of ability of an object to resist elastic deformation.

It can be understood that in this embodiment, the elastic modulus of the planarization layer 20 located in the bending area A1 is set to be greater than the elastic modulus of the planarization layer 20 located in the non-bending area A2, that is, the deformation resistance of the planarization layer 20 located in the bending area A1 is greater than the deformation resistance of the planarization layer 20 located in the non-bending area A2. In this embodiment, the deformation resistance of the planarization layer 20 located in the bending area A1 is enhanced, thereby weakening the degree of deformation of the planarization layer 20 in the bending area A1, and preventing the protrusions 40 located in the bending area A1 from piercing the planarization layer 20 during the bending process, which may lead to disconnection of the driving circuit layer 30.

Figure 5:
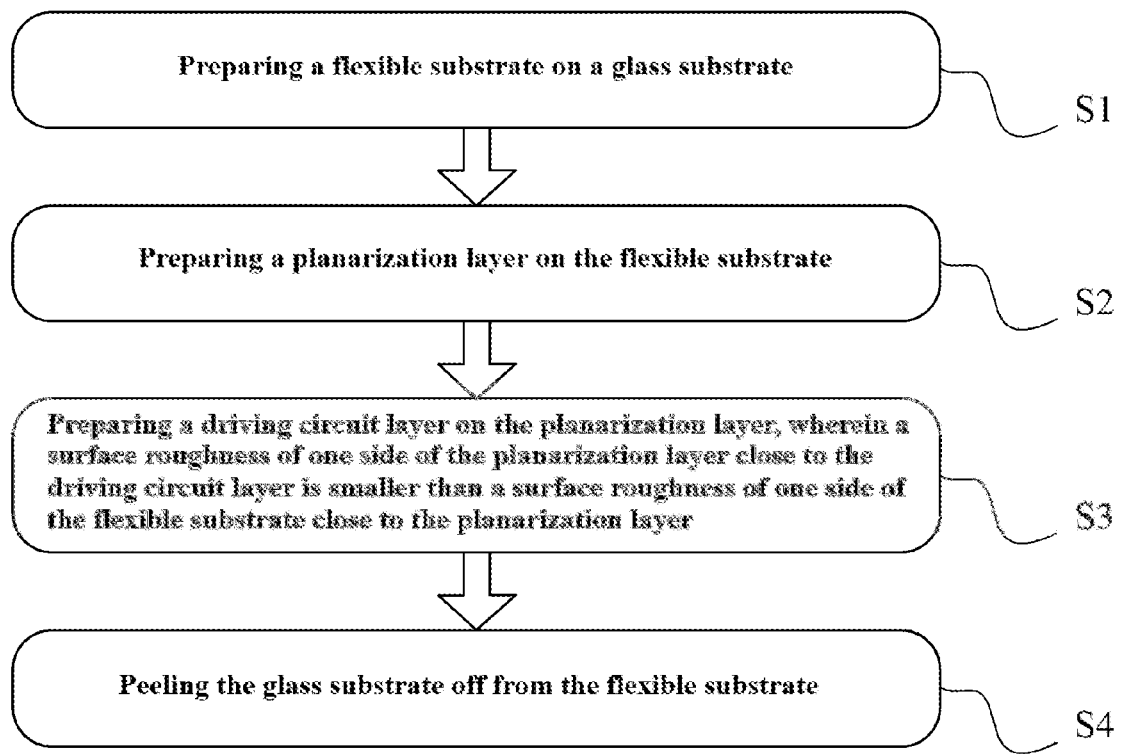
FIG. 5 is a flowchart of a manufacturing method of a backplane according to an embodiment of the present disclosure.

Next, with reference to FIG. 5, which is flowchart of a manufacturing method of a backplane according to an embodiment of the present disclosure. The manufacturing method of a backplane comprises steps of:

S1, preparing a flexible substrate on a glass substrate:

S2, preparing a planarization layer on the flexible substrate:

S3, preparing a driving circuit layer on the planarization layer, wherein a surface roughness of one side of the planarization layer close to the driving circuit layer is smaller than a surface roughness of one side of the flexible substrate close to the planarization layer; and S4, peeling the glass substrate off from the flexible substrate.

It should be noted that, in the pesent disclosure, the flexible substrate is planarized and then the driving circuit layer is deposited, which may reduce a possibility of the metal conductive layer in the driving circuit layer being pierced, especially for process sites in which pressure needs to be applied on the plane in a rear stage. The planarization layer may further reduce a probability of the metal conductive layer climbing a slope at a position of the protrusions on the flexible substrate, reduce a risk of disconnection caused by climbing, reduce bright and dark lines caused by the disconnection, and improve display quality. The planarization layer can cover the protrusions. After the planarizing process, there is no need to clean the machine equipment, and problems caused by cleaning can be reduced, and waste of manpower and material resources caused by cleaning can be avoided. There are many process sites in the preparation process of a backplane, and the film is easy to be damaged. By adding the planarization layer, a total film layer thickness of the backplane can be increased, and damage to the film layer caused in the operation process, such as bending stress, sharp scratches caused by undesirable operation can be reduced.

Figure 6:
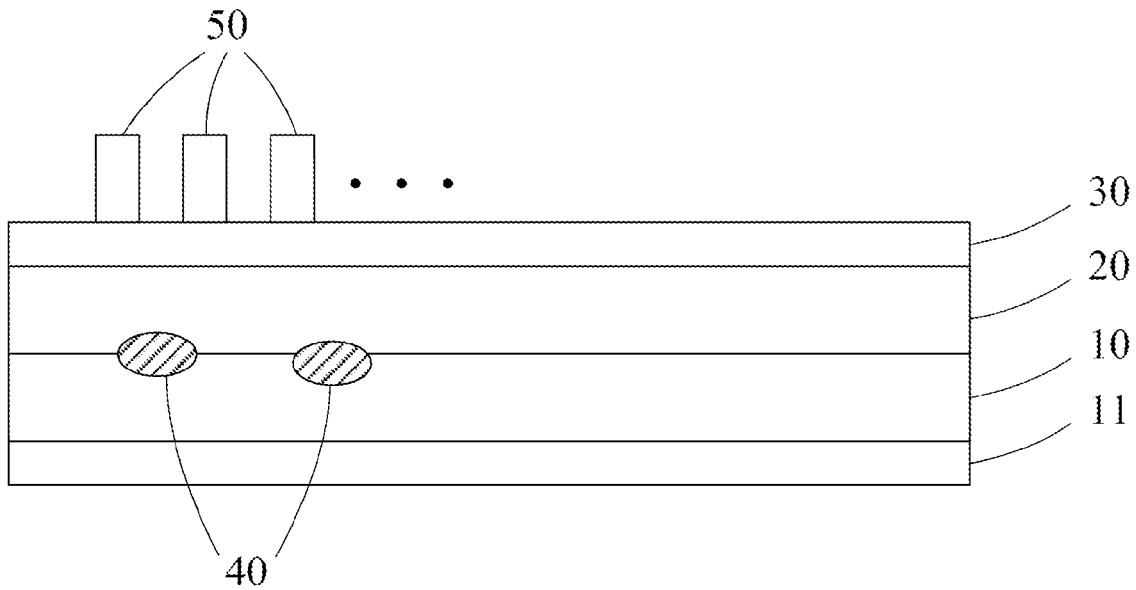
FIG. 6 is a schematic diagram of a basic structure of a semi-finished product in a manufacturing process flow of a backplane according to an embodiment of the present disclosure.

Next, with reference to FIG. 6, which is a schematic diagram of a basic structure of a semi-finished product in a manufacturing process flow of a backplane according to an embodiment of the present disclosure. In the manufacturing process, firstly, a flexible substrate 10, a planarization layer 20, a driving circuit layer 30, and light-emitting devices 50 need to be formed on a glass substrate 11. After manufacturing the light-emitting devices 50, the glass substrate 11 is peeled off from the flexible substrate 10 to obtain a flexible backplane.

Embodiments of the present disclosure provide a backlight module, which comprises the above-described backplane and an optical film set, wherein the optical film set is located on a light-emitting side of the backplane. The basic structure and manufacturing method of the backplatne are shown in FIGS. 1-6 and the description with reference to the FIGS. 1-6, which are not repeated here. The optical film set comprises at least one optical film, and the optical film comprises a diffusion film and a brightness enhancement film. It may be understood that the backplane provided in this embodiment of the present disclosure may be a backplane of a backlight module.

Embodiments of the present disclosure provide a display panel, which comprises the above-described backplane and a protective layer, wherein the protective layer is located on a light-emitting side of the backplane. The basic structure and manufacturing method of the backplatne are shown in FIGS. 1-6 and the description with reference to the FIGS. 1-6, which are not repeated here. The protective layer is used to protect the light-emitting devices on the backplane. It can be understood that the backplane provided in embodiments of the present disclosure may be a backplane of a display panel.

Embodiments of the present disclosure further provide a display terminal, which comprises a terminal body and the above-described backplane display panel, wherein the terminal body and the display panel are assembled as a whole. The display terminal mentioned in embodiments of the present disclosure may be a product or a component with a display function, such as a mobile phone, a tablet computer, a notebook computer, a television, a digital camera, or a navigation device.

As described above, embodiments of the present disclosure provide a backplane, which comprises a flexible substrate, a planarization layer, and a driving circuit layer. The planarization layer is disposed on the flexible substrate, and the driving circuit layer is disposed on the planarization layer. A a surface roughness of one side of the planarization layer close to the driving circuit layer is smaller than a surface roughness of one side of the flexible substrate close to the planarization layer. In the present disclosure, a planarization layer is disposed between a flexible substrate and a driving circuit layer, and a surface roughness of one side of the planarization layer close to the driving circuit layer is smaller than a surface roughness of one side of the flexible substrate close to the planarization layer, so as to planarize a difference between the flexible substrate and protrusions on the flexible substrate, reduce impact of protrusions on the driving circuit layer, enable the driving circuit layer to be deposited evenly, reduce risk of metal conductive layer being pierced and disconnected, improve reliability of the backplane and improve display quality. Moreover, there is no need to repeatedly clean the machine equipment, the process is simple, and the added planarization layer can also reduce the risk of the metal conductive layer being damaged when the underlying glass substrate is peeled off. Technical problems as follows have been solved: the flexible substrate of the backplane in the prior art has a plurality of protrusions, so that the metal conductive layer is easy to be pierced, resulting in climbing a slope and disconnection; if a method of cleaning the machine equipment is used to reduce the protrusions, the using time of the machine, manpower and materials of the flexible substrate are wasted, and the protrusions cannot be completely cleaned; and a risk of damage to the metal conductive layer is high when the underlying glass substrate is peeled off.

The backplane, the backlight module, and the display panel provided in embodiments of the present disclosure are described in detail above. It should be understood that the exemplary embodiments described herein should only be considered descriptive in order to help understand the method and core ideas of the present disclosure, and not to limit the present disclosure.

What is claimed is:

1. A backplane, comprising:
  a flexible substrate;
  a planarization layer disposed on the flexible substrate; and
  a driving circuit layer disposed on the planarization layer;
  wherein a surface roughness of one side of the planarization layer close to the driving circuit layer is smaller than a surface roughness of one side of the flexible substrate close to the planarization layer; and
  wherein the backplane comprises a bending area and non-bending areas located on both sides of the bending area, wherein an elastic modulus of the planarization layer located in the bending area is greater than that of the planarization layer located in the non-bending area.

2. The backplane according to claim 1, wherein the planarization layer has a thickness of is greater than or equal to half of that of the flexible substrate and less than or equal to twice of that of the flexible substrate in a direction from the flexible substrate to the planarization layer.

3. The backplane according to claim 2, wherein a material of the planarization layer is an inorganic insulating material, and the planarization layer has a thickness of greater than or equal to that of the flexible substrate and less than or equal to twice of that of the flexible substrate in a direction from the flexible substrate to the planarization layer.

4. The backplane according to claim 3, wherein the material of the planarization layer is any one of silicon nitride, silicon oxide, and silicon oxynitride.

5. The backplane according to claim 2, wherein a material of the planarization layer is an organic insulating material, and the planarization layer has a thickness of greater than or equal to half of that of the flexible substrate and less than that of the flexible substrate in a direction from the flexible substrate to the planarization layer.

6. The display panel according to claim 2, wherein the planarization layer has a thickness of greater than or equal to 10 microns and less than or equal to 20 microns in a direction from the flexible substrate to the planarization layer.

7. The backplane according to claim 1, further comprising a plurality of light-emitting devices on the driving circuit layer, and the plurality of light-emitting devices are electrically connected to the driving circuit layer.

8. A backlight module, comprising a backplane and an optical film set, wherein the optical film set is located on a light-emitting side of the backplane, and the backplane comprises:
  a flexible substrate;
  a planarization layer disposed on the flexible substrate; and
  a driving circuit layer disposed on the planarization layer;
  wherein a surface roughness of one side of the planarization layer close to the driving circuit layer is smaller than a surface roughness of one side of the flexible substrate close to the planarization layer; and
  wherein the backplane comprises a bending area and non-bending areas located on both sides of the bending area, wherein an elastic modulus of the planarization layer located in the bending area is greater than that of the planarization layer located in the non-bending area.

9. The backlight module according to claim 8, wherein the planarization layer has a thickness of greater than or equal to half of that of the flexible substrate and less than or equal to twice of that of the flexible substrate in a direction from the flexible substrate to the planarization layer.

10. The backlight module according to claim 9, wherein a material of the planarization layer is an organic insulating material, and the planarization layer has a thickness of greater than or equal to half of that of the flexible substrate and less than that of the flexible substrate in a direction from the flexible substrate to the planarization layer.

11. The backlight module according to claim 9, wherein a material of the planarization layer is an inorganic insulating material, and the planarization layer has a thickness of greater than or equal to that of the flexible substrate and less than or equal to twice of that of the flexible substrate in a direction from the flexible substrate to the planarization layer.

12. The backlight module according to claim 8, wherein the backplane further comprises a plurality of light-emitting devices on the driving circuit layer, and the plurality of light-emitting devices are electrically connected to the driving circuit layer.

13. A display panel, comprising a backplane and a protective layer, wherein the protective layer is located on a light-emitting side of the backplane, and the backplane comprises:
a flexible substrate;
a planarization layer disposed on the flexible substrate; and
a driving circuit layer disposed on the planarization layer;
wherein a surface roughness of one side of the planarization layer close to the driving circuit layer is smaller than a surface roughness of one side of the flexible substrate close to the planarization layer; and
wherein the backplane comprises a bending area and non-bending areas located on both sides of the bending area, wherein an elastic modulus of the planarization layer located in the bending area is greater than that of the planarization layer located in the non-bending area.

14. The display panel according to claim 13, wherein the planarization layer has a thickness of greater than or equal to half of that of the flexible substrate and less than or equal to twice of that of the flexible substrate in a direction from the flexible substrate to the planarization layer.

15. The display panel according to claim 13, wherein a material of the planarization layer is an inorganic insulating material, and the planarization layer has a thickness of greater than or equal to that of the flexible substrate and less than or equal to twice of that of the flexible substrate in a direction from the flexible substrate to the planarization layer.

16. The display panel according to claim 13, wherein a material of the planarization layer is an organic insulating material, and the planarization layer has a thickness of greater than or equal to half of that of the flexible substrate and less than that of the flexible substrate in a direction from the flexible substrate to the planarization layer.

17. The display panel according to claim 13, wherein the backplane further comprises a plurality of light-emitting devices on the driving circuit layer, and the plurality of light-emitting devices are electrically connected to the driving circuit layer.

* * * * *